United States Patent [19]

Upton

[11] 4,395,732
[45] Jul. 26, 1983

[54] STATISTICALLY ADAPTIVE ANALOG TO DIGITAL CONVERTER

[75] Inventor: Eric L. Upton, Mesa, Ariz.

[73] Assignee: Motorola Inc., Schaumburg, Ill.

[21] Appl. No.: 294,273

[22] Filed: Aug. 19, 1981

[51] Int. Cl.³ .............................................. H04N 5/14
[52] U.S. Cl. ................................. 358/169; 358/160; 358/166; 340/347 AD
[58] Field of Search ................. 358/10, 139, 166, 169, 358/160; 340/347 AD

[56] References Cited

U.S. PATENT DOCUMENTS

| | | | |
|---|---|---|---|
| 3,983,320 | 9/1976 | Ketcham | 358/166 |
| 4,028,694 | 6/1977 | Cook | 340/347 AD |
| 4,064,484 | 12/1977 | Mese | 358/169 |
| 4,160,194 | 7/1979 | Anderson | 358/166 |
| 4,334,244 | 6/1982 | Chan | 358/166 |

*Primary Examiner*—Michael A. Masinick
*Attorney, Agent, or Firm*—Eugene A. Parsons

[57] ABSTRACT

An improvement in an analog-to-digital converter wherein a series string of capacitors is utilized to generate reference voltages for the comparators of the converter. The digitized output of the converter is then used to control a predetermined timed discharge from a selected one of the series string of capacitors. The converter, as described, may be used in a video system as an adaptive contrast enhancement mechanism.

3 Claims, 6 Drawing Figures

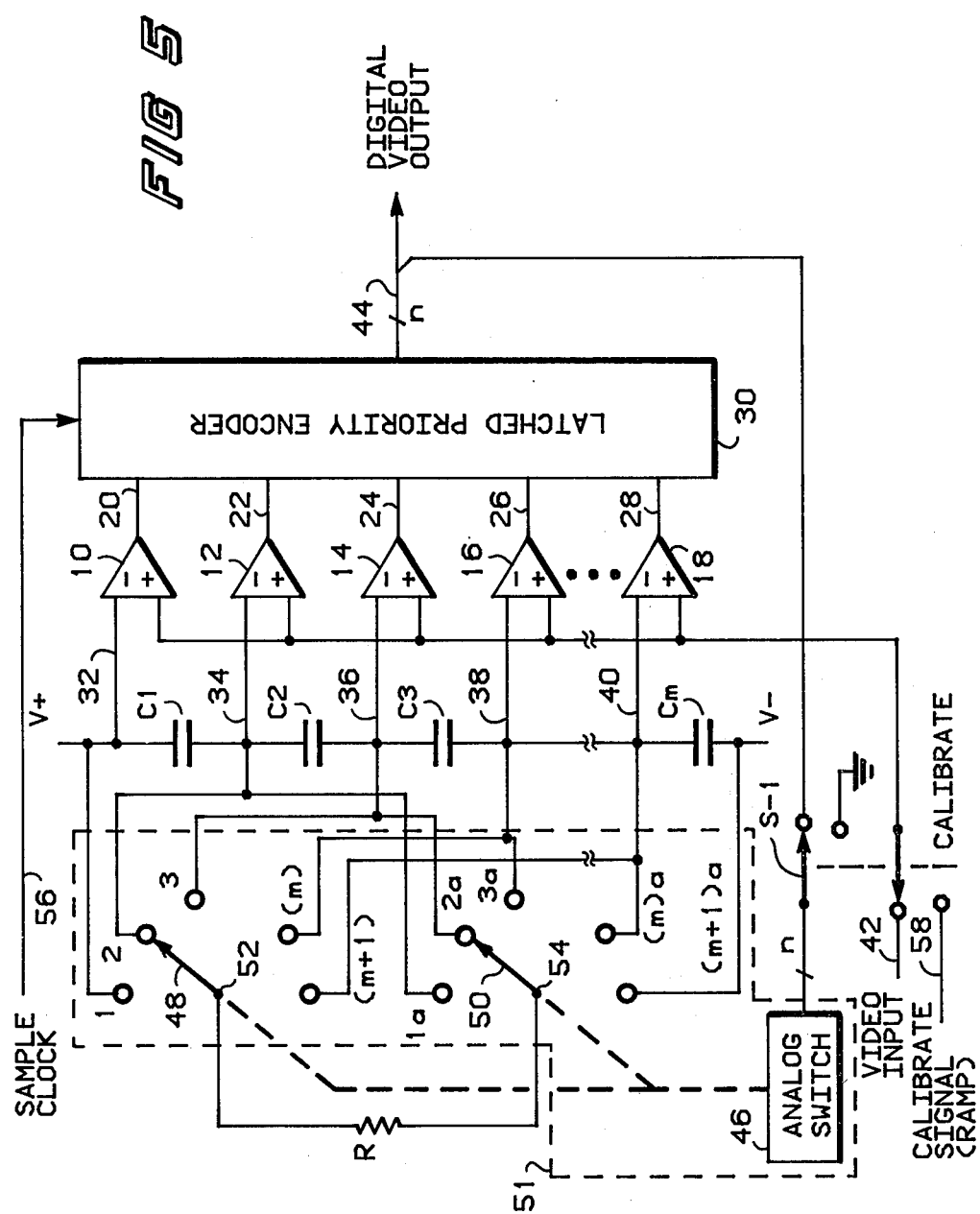

STATISTICALLY ADAPTIVE ANALOG TO DIGITAL CONVERTER

FIELD OF THE INVENTION

The invention relates to a method for enhancing the contrast in a video signal utilizing an analog to digital converter with reference voltages set across a series connected string of capacitors.

BACKGROUND OF THE INVENTION

"Image Enhancement by Histogram Transformation", has been described in a paper bearing that title by Robert Hummel, *Computer Graphics and Image Processing,* 6, 184–195 (1977):

> "The visual contrast of a digitized image can be improved by adjusting the Gray scale so that the histogram of the resulting image is flat. This increase in visual contrast is an artifical enhancement due to a more judicious choice of the relative intensities represented by the quantization levels of the original image. Although the process provides no enhancement in an information-theoretic sense, applying the appropriate transformation can result in a remarkable increase in visual clarity."

Hummel goes on to describe two general categories of transformation systems. The first is defined by Graylevel bins which can only be merged together but wherein no bin can be broken up. If the original histogram has very large peaks the transformed histogram will be only approximately flat. While contrast is improved in a system of this sort, Hummel teaches an improved system wherein very small bins are generated with exactly the right number of points, that is, some of the bins in the original image are broken up and then width is no longer an integral multiple of original bin widths. Hummel also discusses the relative pros and cons of neighborhood enhancement versus global enhancement and suggests the combining of both in some applications.

In a paper entitled "On-Line Image Enhancement In The Time Domain With A Microprocessor" by Z. Orbach et al, *IEEE Transactions,* April, 1979, pp. 226–231, a system is described which provides histogram gathering and image transformation as semi-independent subsystems controlled by a microprocessor leaving the computationally intensive task of determining the transformation to the microprocessor thereby allowing performance of video enhancement dynamically by means of simultaneous histogram gathering and image transformation. An algorithm is described for the computation required and is applicable to both histogram equalization and histogram hyperbolization. The system requires digitization of the video input by means of an analog-to-digital converter and a reverse transformation from digital to analog by means of a D/A converter at the video output. The digital means provided between the input and output converters is limited by reason of the discrete digital increments produced by the input analog-to-digital converter. The digital system presented is relatively complex.

The A/D converter typically used in prior art employs a series resistor divider for establishing reference voltages for each of the comparators in the A/D converter. See FIG. 1. If the required histogram transformation could be predetermined, the values of R1, R2, . . . and RM might be set to provide the required histogram required for a given degree of video enhancement. However, the desired histogram transformation is a function of the video grey scale distribution in a particular video signal.

SUMMARY OF THE INVENTION

According to the present invention the above-mentioned problems are solved by means of the substitution of a capactive reference string in place of the resistors of FIG. 1. This allows reference voltages applied to the individual comparator circuits 10, 12, 14, 16, 18 to be adjusted to provide probability equalization by means of non-linear threshold separation. This is accomplished by selectively discharging one of the string of capacitors $C_1$, $C_2$, $C_3$, and $C_m$ as a function of the particular bin recognized by the comparators by means of encoder 30.

It is therefore an object of the invention to provide a simplified adaptive means for establishing a flat histogram in response to any distribution of Gray scales within a given video signal.

It is another object of the invention to modify the reference signal inputs to a series of analog comparators in an analog-to digital converter by adjusting the voltage on a series string of capacitors which provide the reference voltages.

It is still another object of the invention to selectively discharge a particular capacitor in a string of capacitors providing reference voltages to a series of analog comparators in an analog-to-digital converter by utilizing the output of an encoder of the A/D converter for selection of the particular capacitor to be discharged.

It is still a further object of the invention to redistribute the individual voltages on a series string of capacitors supplying reference voltages to a string of analog comparators in an analog-to-digital converter such that the total voltage across the capacitors is the same while the distribution of voltages on particular capacitors is non-linear as a function of the output of an encoder fed by the comparators in the A/D converter.

These and other objects and advantages of the invention may be better understood by a study of the detailed description of the invention, infra, taken together with the drawings in which:

FIG. 1 is a schematic diagram of a prior art A/D converter utilizing a series string of resistors for establishing reference voltages, FIG. 2 is a graph showing the input probability distribution function of a typical video signal with linear threshold separation, FIG. 3 is a histogram showing the accumulative distribution of Gray scale levels in a typical video input signal, such as that shown in FIG. 2, FIG. 4 shows a flattened histogram in which the threshold separation is non-linear according to the teachings of the present invention, FIG. 5 is a combination schematic and block diagram of the best embodiment of the instant invention, and FIG. 6 is a flow chart of the method of histogram flattening used in the present invention.

DETAILED DESCRIPTION OF THE INVENTION

Figure 1:
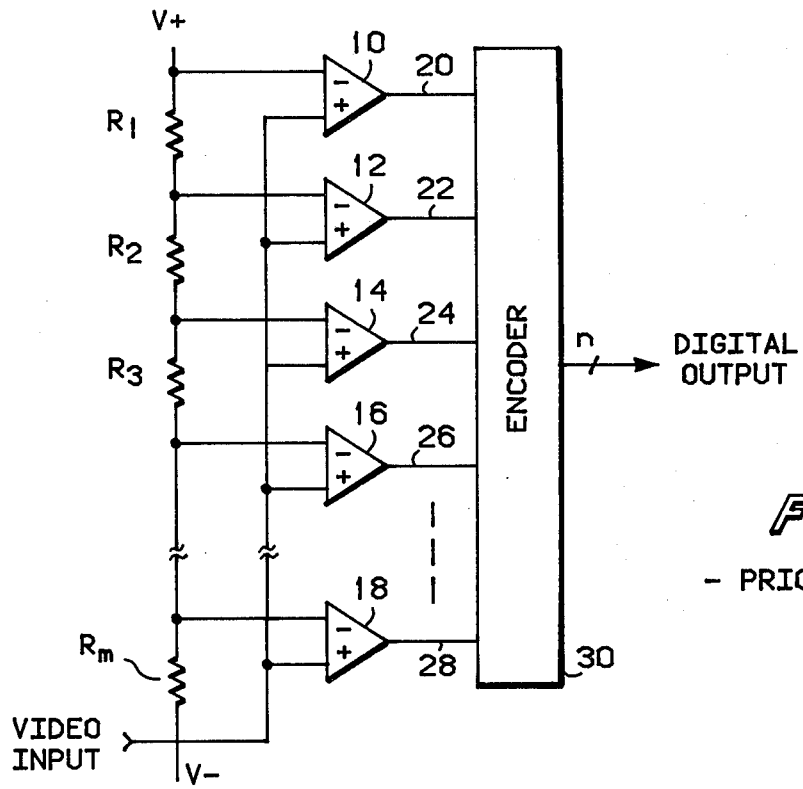

The quantization efficiency of an A/D converter can be maximized if the quantization thresholds are determined by the statistical distribution of the analog input.

Each of the thresholds tracks a probability density function where each threshold is statistically as significant as every other threshold and therefore the quantizer's dynamic range is not wasted. The quantization thresholds are achieved by way of a coded feedback function. A combination schematic and block diagram of the invention is shown in FIG. 5 wherein the digital feedback code partially reduces the charge on the individual capacitor that bounded the code's analog. The capacitors, $C_1$, $C_2$, $C_3$... and $C_M$ are a series string connected between supply voltages V+ and V−. The voltage V+ is applied by means of line 32 to the negative input of comparator 10. This voltage also appears at the upper end of capacitor $C_1$. The voltage appearing at the node between capacitor $C_1$ and $C_2$ is applied by means of line 34 to the negative input of comparator 12. The voltage appearing at the node between capacitor $C_2$ and $C_3$ is applied by means of line 36 to comparator 14. The voltage at the bottom of capacitor $C_3$ is applied by means of line 38 to the negative input of comparator 16. The voltage appearing at the upper end of capacitor $C_M$ is applied by means of line 40 to the negative input of analog comparator 18. The lower end of capacitor $C_M$ is connected to voltage supply V−. Video input 42 is applied to the positive inputs of analog comparators 10, 12, 14, 16 and 18, via switch S-1. Outputs 20, 22, 24, 26, and 28 of comparators 10, 12, 14, 16, and 18, respectively, are applied to the input of latch priority encoder 30. It should be noted that the broken lines and the use of subscripts 1 through m indicates that the number of comparators and associated circuits is a design choice depending on the level of digitization required in a given application. The relationship $m=2^n$ holds where n is the number of wires (or bits) out of encoder 30. Latch priority encoder 30 may be, for example, purchased from Texas Instrument Corporation as Part Number SN74LS148. The comparator array comprising analog comparators 10, 12, 14, 16, and 18 may be procured, for example, from National Semiconductor Corporation as Part Number LM-711 or from Motorola, Inc. as Part Number MC-1711. The output of latch priority encoder 30 comprises n lines where the relationship between n and m is defined as m equal $2^n$. Output 44, an n line output, provides a digitized video output from the system of the invention and is also fed to the input of analog switch 51 through switch S-1. Analog switch 51 includes a control circuit 46, switch poles 48 and 50, and switch contacts 1, 2, 3 ... m-2 and m-1 of dual pole 48 and 50. Resistor R is connected between the dual pole switch fixed points 52 and 54. Contact 1 of switch pole 48 is connected to the upper end of capacitor $C_1$. Contact 1A of pole 50 is connected to the lower end of capacitor $C_1$. Therefore, it may be seen that the resistor R will be connected across capacitor $C_1$ when poles 48 and 50 are in the contact 1 and 1a positions. If the n output lines 44 from latch priority encoder 30 select position 1 for poles 48 and 50, resistor R is connected in parallel with $C_1$ for a period of time determined by sample clock 56 which is fed to latch priority encoder 30. This means that, during that period of time, capacitor $C_1$ is discharged through resistor R having a time constant determined by: $T_C = RC_m$. $RC_m$ will typically be selected to be long with reference to clock 56 time. Similarly, resistor R may be connected across any of capacitors $C_1$, $C_2$, $C_3$ ... $C_m$, depending on the switch position selected by analog switch control 46. The analog switch 51 comprising control 46 and switches 48 and 50 may be an analog multiplexer which may be procured from Harris Corp. as part number HI-506. The capacitor which is discharged by resistor R is determined solely by the signal on n line output 44 from latch priority encoder 30. Each event of a code (n) negatively reinforces its future probability of event such that other code's probability of event are increased to be equal to code (n) probability. FIG. 5 further illustrates the mechanisms by which the quantization thresholds are achieved. The capacitors $C_1$, $C_2$, $C_3$... $C_m$ hold the value of a threshold step while resistor R is used to discharge any individual capacitor each time the capacitors respective code is employed. The time constraint of the adaptive process is appropriately set at one video line duration or in general may be the time constant as set out above.

Since the threshold distribution may be different from line to line, a calibrate cycle is initiated at the end of each line. Calibration is accomplished by simultaneously disabling the feedback control by grounding switch S-1 and injecting a linear ramp signal on line 58 to take the place of the video input, as shown in FIG. 5. The codes which evolve are used during the reconstruction phase. The codes are substituted for their respective linear ramp binary values.

Sample clock on line 56 prevents oscillation and provides synchronous data transfer.

Figure 2:
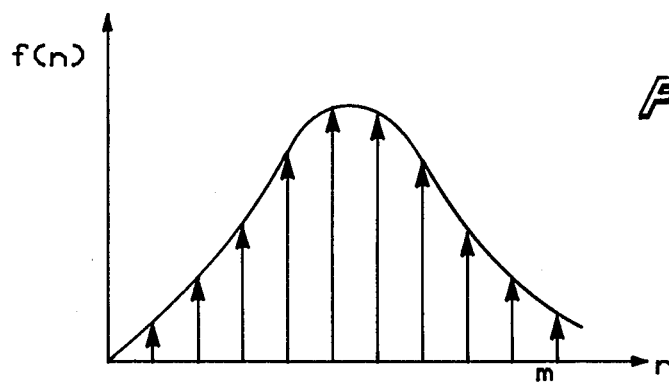
Figure 3:
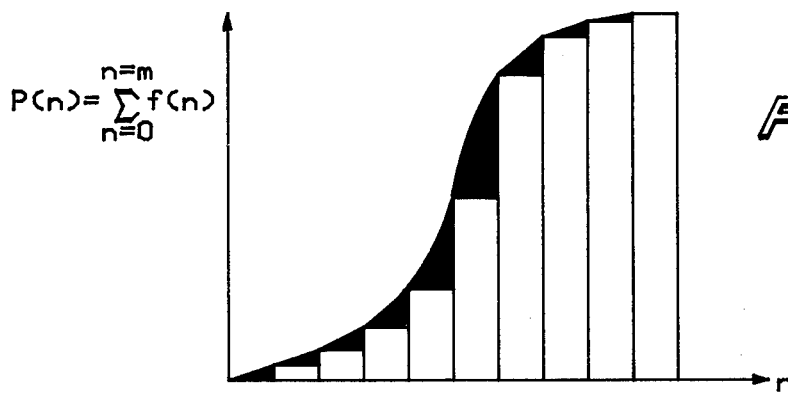
Figure 4:
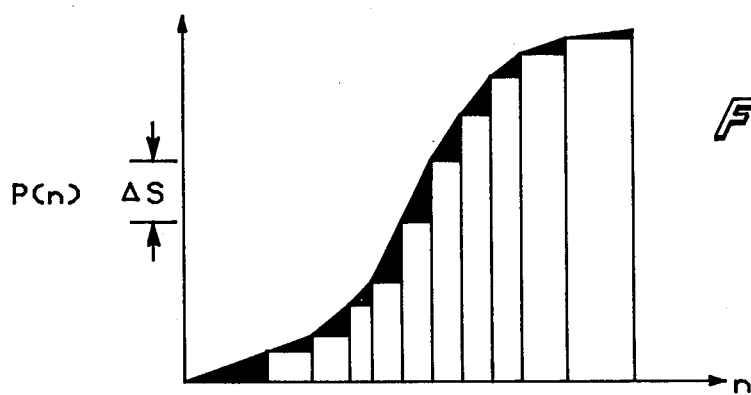

FIGS. 2 through 4 further develop the functional transformation. FIG. 2 represents an example probability distribution of the input signal. In this case m=16 for a 4-bit converter. ($Log_2\ 16 = 4$). FIG. 3 is the accumulative distribution function and is obtained by integrating the probability distribution function of FIG. 2. Note the large shaded areas formed between what would be the continuous distribution function and the linearly distributed discrete cumulative distribution. FIG. 4 illustrates the results of non-linear cumulative distribution. The thresholds (n') are modified such that an even probabilistic function of $\Delta S$ is imposed on P(n). This results in a reduced quantization error denoted by the reduced shaded area. The resistor array of the parallel A/D converter of FIG. 1 has been replaced with a capacitor array shown in FIG. 5. The charge on the array piecewise represents the probability function shown in FIG. 4. The charge is uniquely established via a feedback control circuit that distributes and integrates the probability distribution function.

Because of the adaptive capability of the non-linear voltage distribution across the capacitors of the reference voltage developing portion of the system, system resolution is not limited, as in the prior art, to specific digitization increments in a prior art A/D converter utilizing a series resistor string for a reference voltage generator. This means that the practical resolution of the system is much improved over the prior art systems which utilized digital techniques for histogram flattening or shapeing.

Figure 6:
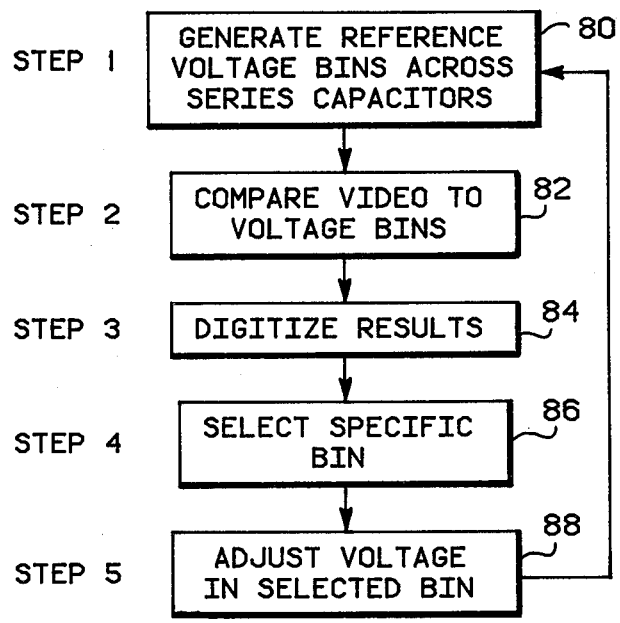

FIG. 6 represents a flow chart for the system of the invention. The cyclic operation begins with step 1 as indicated at reference numeral 80, wherein a reference voltage is generated as a series of voltage bins across series capacitors. In step 2 the analog video signal is compared to the voltage bins as indicated by reference numeral 82. The results of the comparison are digitized in step 3 according to reference numeral 84. In step 4 a specific bin is selected according to reference numeral 86. Step 5 comprises adjusting the voltage in the selected bin downward according to reference numeral 88. The process is then repeated by returning to reference numeral 80 and step 1. This simple 5 step procedure provides a flattened histogram for enhancing the contrast in an input analog video signal which appears at an output of the system in digital form.

While the invention has been particularly shown and described with reference to a preferred embodiment thereof, it will be understood by those skilled in the art that various other modifications and changes may be made to the present invention from the principles of the invention described above without departing from the spirit and scope thereof, as encompassed in the accompanying claims. Therefore, it is intended in the appended claims to cover all such equivalent variations as come within the scope of the invention as described.

What is claimed is:

1. In a system for contrast enhancement of digital video signals, the improvement comprising:
   a series string of capacitors, said series string being connected to at least a pair of voltage sources and defining a plurality of nodes;
   a plurality of comparator circuits having inputs connected to the nodes;
   a priority encoder being connected to receive signals from the plurality of comparator circuits;
   an analog switch having a controller connected to said encoder and dual poles, each of said dual poles having a fixed end and a plurality of fixed contacts placed at a plurality of throw positions, the fixed contacts of each of the dual poles being connected to different ones of said nodes so that the fixed ends of the dual poles have a different one of said capacitors connected therebetween in each of the throw positions, and each throw position of the dual poles being controlled by signals from said priority encoder supplied to the controller; and
   a resistor connected to the fixed ends of said dual poles.

2. An analog to digital converter which utilizes a plurality of reference voltages applied to inputs of a like plurality of comparators, each comparator having an output responsive to a comparison between a reference voltage and an applied voltage, wherein the reference voltages are generated by a circuit comprising:
   means for applying at least two source voltages;
   a plurality of series connected capacitors, said plurality of capacitors being connected between said at least two source voltages;
   means for digitally encoding the outputs of the plurality of comparators;
   means for discharging a capacitor; and
   means for switching said discharging means in parallel with one of said plurality of capacitors responsive to a specific output from said means for digitally encoding, said specific output being indicative of a positive comparison between the reference voltage on said one of said plurality of capacitors and the applied voltage.

3. An improved method for contrast enhancement of an analog video signal comprising the steps of:
   generating a plurality of specific reference voltages by impressing a d.c. voltage across a series connected plurality of capacitors;
   comparing an instantaneous portion of the analog video signal to each of the specific voltages;
   digitizing the instantaneous portion of the analog video signal responsive to correlation of the instantaneous portion of the analog video signal with one of said plurality of specific reference voltages;
   selecting said one specific reference voltage responsive to said digitizing step;
   adjusting said one selected reference voltage in a predetermined manner chosen from an increase in voltage and a decrease in voltage; and
   repeating all of said foregoing steps on a predetermined time basis.

* * * * *